United States Patent
Park et al.

(10) Patent No.: US 10,446,697 B2
(45) Date of Patent: Oct. 15, 2019

(54) SOLAR CELL

(71) Applicant: LG ELECTRONICS INC., Seoul (KR)

(72) Inventors: Changseo Park, Seoul (KR); Yoonsil Jin, Seoul (KR); Youngho Choe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/443,331

(22) Filed: Feb. 27, 2017

(65) Prior Publication Data

US 2017/0170340 A1 Jun. 15, 2017

Related U.S. Application Data

(63) Continuation of application No. 13/182,203, filed on Jul. 13, 2011, now Pat. No. 9,608,133.

(30) Foreign Application Priority Data

Jan. 19, 2011 (KR) .................. 10-2011-0005429

(51) Int. Cl.
*H01L 31/0216* (2014.01)
*H01L 31/0224* (2006.01)
(Continued)

(52) U.S. Cl.
CPC .. *H01L 31/02168* (2013.01); *H01L 31/02167* (2013.01); *H01L 31/022425* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2004/0112426 | A1 | 6/2004 | Hagino |
| 2005/0133084 | A1 | 6/2005 | Joge et al. |

(Continued)

FOREIGN PATENT DOCUMENTS

| | | |
|---|---|---|
| CN | 101079967 A | 11/2007 |
| CN | 101681952 A | 3/2010 |

(Continued)

OTHER PUBLICATIONS

Agostinelli, et al., Solar Energy Materials and Solar Cells, 2006, vol. 90, pp. 3438-3443.*
Hoex, et al., Applied Physics Letters, 2006, vol. 89, pp. 042112-1 through 042112-3.*
Arumughan et al., Realization of Thin Mc-Silicon Pert-Type Bifacial Solar Cells in Industrial Environments; Conference Record of the 2006 IEEE 4th World Conference on Photovoltaic Energy Conversion; pp. 1103-1106 (May 1, 2006); XP031007502.

(Continued)

*Primary Examiner* — Sadie White
(74) *Attorney, Agent, or Firm* — Birch, Stewart, Kolasch & Birch, LLP

(57) ABSTRACT

A bifacial solar cell includes a substrate of an n-type; an emitter layer positioned on a first surface of the substrate; a plurality of first electrodes locally positioned on the emitter layer and electrically connected to the emitter layer; a first passivation layer positioned on the emitter layer; a silicon oxide layer formed at an interface between the first passivation layer and the emitter layer, the silicon oxide layer having a thickness of about 1 nm to 3 nm; a first anti-reflection layer positioned on the first passivation layer; a plurality of back surface field layers locally positioned on a second surface of the substrate; a plurality of second electrodes respectively positioned on the plurality of back surface field layers and electrically connected to the plurality of back surface field layers; and a second passivation layer positioned on the second surface of the substrate.

19 Claims, 4 Drawing Sheets

(51) Int. Cl.
*H01L 31/068* (2012.01)
*H01L 31/18* (2006.01)
(52) U.S. Cl.
CPC ........ *H01L 31/068* (2013.01); *H01L 31/0684* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 2005/0176164 A1* | 8/2005 | Gee | H01L 31/03529 438/48 |
| 2006/0157733 A1 | 7/2006 | Lucovsky et al. | |
| 2007/0210395 A1 | 9/2007 | Maruyama et al. | |
| 2009/0108250 A1* | 4/2009 | Kim | H01L 33/465 257/13 |
| 2010/0012185 A1* | 1/2010 | Schmid | H01L 31/022425 136/256 |
| 2010/0147378 A1 | 6/2010 | Lee et al. | |
| 2010/0243040 A1* | 9/2010 | Kim | H01L 31/02245 136/255 |
| 2010/0243041 A1* | 9/2010 | Carlson | H01L 31/022441 136/255 |
| 2010/0275983 A1* | 11/2010 | Kaes | H01L 31/022425 136/255 |
| 2011/0139250 A1* | 6/2011 | Du | H01L 31/02167 136/261 |
| 2011/0140226 A1 | 6/2011 | Jin et al. | |
| 2011/0143486 A1 | 6/2011 | Hama et al. | |
| 2011/0177652 A1* | 7/2011 | Gupta | H01L 31/1804 438/98 |
| 2012/0055547 A1* | 3/2012 | Schultz-Wittmann | H01L 31/02167 136/256 |
| 2012/0174960 A1 | 7/2012 | Hashigami et al. | |

FOREIGN PATENT DOCUMENTS

| | | | |
|---|---|---|---|
| DE | 4217428 A1 | 6/1993 | |
| DE | 10 2007 054 384 A1 | 5/2009 | |
| EP | 2077584 A2 | 7/2009 | |
| EP | 2 479 804 A1 | 7/2012 | |
| JP | 2004-193350 A | 7/2004 | |
| JP | 2005-116906 A | 4/2005 | |
| KR | 10-2009-0078275 A | 7/2009 | |
| KR | 10-2009-0118056 A | 11/2009 | |
| KR | 10-2010-0068832 A | 6/2010 | |
| KR | 10-2010-0096746 A | 9/2010 | |
| KR | 10-2010-0107258 A | 10/2010 | |
| KR | 10-2010-0128727 A | 12/2010 | |
| WO | WO 2009/157079 A1 | 12/2009 | |
| WO | WO 2010/003784 A2 | 1/2010 | |
| WO | WO 2010/111107 A2 | 9/2010 | |
| WO | WO 2010123974 A1 * | 10/2010 | ....... H01L 31/02167 |
| WO | WO 2011/033826 A1 | 3/2011 | |

OTHER PUBLICATIONS

Dingemans et al., Recent Progress in the Development and Understanding of Silicon Surfae Passivation by Aluminum Oxide for Photovoltaics, 5th World Conference on Photovoltaic Energy Conversion, Valencia, Spain; pp. 1083-1090, (2010) XP055010434.
European Search Report for Application No. 11006399.7 dated Nov. 28, 2011.
Glunz et al., Analysis of Laser-Fired Local Back Surface Fields Using n+np+ Cell Structures; Proceedings of the 3rd World Conference on Photovoltaic Energy Conversion; vol. 2, pp. 1332-1335 (May 18, 2003); XP031988020.
Hoex et al., Excellent Passivation of Highly Doped –p-type Si Surfaces by the Negative-Charge-Dielectric Al2O3; Applied Physics Letters; vol. 92, No. 6, pp. 112107-112107-3 (Sep. 11, 2007); XP012099144.
Hubner, "Novel cost-effective bifacial silicon solar cells with 19.4% front and 18.1% rear efficiency," Appl. Phys. Lett., vol. 70, No. 8, Feb. 24, 1997, pp. 1008-1010. XP012018380.
Knobloch et al., "High-Efficiency Solar Cells From FZ, CZ and MC Silicon Material," IEEE Proceedings of the Photovoltaic Specialists Conference, vol. 23, May 10, 1993, pp. 271-276. XP010113395.
Kranzl et al., "Bifacial Solar Cells on Multi-Crystalline Silicon With Boron BSF and Open Rear Contact", Photovoltaic Energy Conversion, Conference Record of the 2006 IEEE 4th World Conference on, IEEE, PI, May 1, 2006, XP 031007467.
Mihailetchi et al., Nitric Acid Pretreatment for the Passivation of Boron Emitters for n-type Base Silicon Solar Cells; Applied Physics Letters; vol. 92, No. 6, pp. 63510-63510 (Feb. 14, 2008); XP012108251.
Schmidt et al., Effective Surface Passivation of Crystalline Silicon Using Ultrathin Al2O3 Films and Al2O3/SiNx Stacks; Physica Status Solidi—Rapid Research Letters; vol. 3, No. 9, pp. 387-389 (Sep. 17, 2009); XP550011115.
Tobias et al., Crystalline Silicon Solar Cells and Modules; Handbook of Photovoltaic Science and Engineering; pp. 255-306 (Apr. 25, 2003); John Wiley & Sons; XP0550056057.
Weiskircher et al., "The Refractive Index of Thin Al2O3 Films", Vacuum, Pergamon Press, GB, vol. 2, No. 1, Jan. 1, 1952, XP 025579636.
Wolf et al., "Silicon Processing for the VLSI Era," vol. 1: Process Technical, Lattice Press, Second Edition, Chapter 8, 2000, pp. 265-323, XP001525854.
Yoon et al., "Refractive Index and Etched Structure of Silicon Nitride Waveguides Fabricated by PECVD", Thin Solid Films, Elsevier-Sequoia S.A. Lausanne, CH, vol. 515, No. 12, Apr. 23, 2007, XP 022212172.
B. Hoex, J. Schmidt, P. Pohl, M.C. van de Sanden, W.M.M. Kessels, "Silicon Surface passivation by atomic layer deposited Al2O3", J. Appl. Phys. vol. 104, 2008, p. 044903-1 to 044903-12.
English translation of DE 42 17 428 A1.
Gielis et al "Negative charge and charging dynamics in Al 2 O 3 films on Si chracterized by second-harmonic generation" Journal of Applied Physics, 073701, 2008, p. 1-5.

* cited by examiner

SOLAR CELL

CROSS-REFERENCE TO RELATED APPLICATIONS

This Application is a Continuation of co-pending U.S. patent application Ser. No. 13/182,203 filed on Jul. 13, 2011, which claims the benefit under 35 U.S.C. § 119(a) to Korean Patent Application No. 10-2011-0005429 filed on Jan. 19, 2011, all of which are hereby expressly incorporated by reference into the present application.

BACKGROUND OF THE INVENTION

Field of the Invention

Embodiments of the invention relate to a solar cell.

Discussion of the Related Art

Solar power generation to convert light energy into electric energy using a photoelectric conversion effect has been widely used as a method for obtaining eco-friendly energy. A solar power generation system using a plurality of solar cell panels has been installed in places, such as houses due to an improvement in a photoelectric conversion efficiency of solar cells.

The solar cell generally includes a substrate and an emitter layer that forms a p-n junction along with the substrate, thereby generating an electric current from light incident on the solar cell through one surface of the substrate. Further, an anti-reflection layer is formed on a light receiving surface of the substrate, so as to reduce a reflectance of light incident on the substrate and increase a light transmittance of a predetermined wavelength band. Hence, the photoelectric conversion efficiency of the solar cell increases.

Because light is generally incident on the solar cell through only one surface of the substrate, current conversion efficiency of the solar cell is low. Accordingly, a double-sided light receiving solar cell, in which light is incident on the solar cell through both surfaces of the substrate, has been recently developed.

SUMMARY OF THE INVENTION

Embodiments of the invention provide a solar cell with high efficiency.

In one aspect, there is a solar cell including a substrate of a first conductive type, an emitter layer positioned at one surface of the substrate, the emitter layer being a second conductive type opposite the first conductive type, a first electrode electrically connected to the emitter layer, a first protective layer positioned on a front surface of the emitter layer where the first electrode is not positioned, a back surface field layer positioned at another surface of the substrate, a second electrode electrically connected to the back surface field layer, and a second protective layer positioned on a back surface of the substrate where the second electrode is not positioned, wherein each of the first protective layer and the second protective layer is formed of a material having fixed charges of the same conductive type as the first conductive type, wherein the back surface field layer is locally positioned at the back surface of the substrate.

Each of the first protective layer and the second protective layer contains aluminum oxide ($AlO_X$) or yttrium oxide ($Y_2O_3$) having negative fixed charges. Each of the first protective layer and the second protective layer has a refractive index of about 1.55 to 1.7 and a thickness of about 5 nm to 30 nm.

The back surface field layer is formed at the same location of the substrate 110 as the second electrode and has a surface resistivity of about 30 $\Omega$/sq to 80 $\Omega$/sq. A width of the back surface field layer may be equal to or less than a width of the second electrode, or may be greater than a width of the second electrode.

The first anti-reflection layer may be formed of silicon nitride ($SiN_X$) having positive fixed charges.

The solar cell may further include a second anti-reflection layer positioned on a back surface of the second protective layer. The second anti-reflection layer may be formed of silicon nitride ($SiN_X$) having positive fixed charges.

Each of the first anti-reflection layer and the second anti-reflection layer may have a refractive index of about 1.9 to 2.3 and a thickness of about 50 nm to 100 nm.

The substrate may have a first textured surface corresponding to the surface of the substrate, at which the emitter layer is positioned, and a second textured surface corresponding to the surface of the substrate, at which the back surface field layer is positioned.

The first electrode and the second electrode may be formed of different materials. For example, the first electrode may be formed of a conductive paste containing a mixture (Ag:Al) of silver (Ag) and aluminum (Al), and the second electrode may be formed of a conductive paste containing silver (Ag).

The first electrode and the second electrode may have the same width.

The substrate is formed of phosphorus (P)-doped n-type silicon wafer and has resistivity of about 1 $\Omega \cdot cm^2$ to 10 $\Omega \cdot cm^2$.

The emitter layer may include a first doped region, which is lightly doped with impurities of the second conductive type, and a second doped region, which is more heavily doped than the first doped region with impurities of the second conductive type.

The second doped region may be formed at the same location of the substrate as the first electrode. A width of the second doped region may be equal to or less than a width of the first electrode, or may be greater than a width of the first electrode.

The first doped region has a surface resistivity of about 80 $\Omega$/sq to 200 $\Omega$/sq, and the second doped region has a surface resistivity of about 30 $\Omega$/sq to 80 $\Omega$/sq.

According the above-described characteristics, aluminum oxide ($AlO_X$) or yttrium oxide ($Y_2O_3$) for forming the first protective layer has excellent chemical passivation characteristic resulting from a low interface trap density and excellent field effect passivation characteristic resulting from the negative fixed charges. Further, the material is very excellent in stability, moisture transmission, and abrasion resistance. Thus, the first protective layer may reduce a surface recombination velocity, thereby improving the efficiency and the reliability of the solar cell.

Because the back surface field layer is locally positioned at only the same location of the substrate as the second electrode, an influence of the second protective layer formed of aluminum oxide ($AlO_X$) or yttrium oxide ($Y_2O_3$) on carriers moving to the back surface field layer may be minimized.

The second doped region of the emitter layer is formed at only the same location of the substrate as the first electrode, and the first doped region having an impurity concentration lower than the second doped region is formed in the remaining area. Therefore, the solar cell according to the embodiment of the invention may further reduce the recombination of carriers than a solar cell including an emitter layer, whose the entire region is a heavily doped region. Hence, the solar cell according to the embodiment of the invention may secure a low serial resistance.

Both a front surface of the substrate, on which the first electrode is positioned, and a back surface of the substrate, on which the second electrode is positioned, are the textured surfaces, the first protective layer and the first anti-reflection layer are formed on the front surface of the substrate, and the second protective layer and the second anti-reflection layer are formed on the back surface of the substrate. Therefore, light, which is incident on the front surface of the substrate and then passes through the substrate, is again incident on the back surface of the substrate. As a result, the light may be used to generate electric current. Thus, the efficiency of the solar cell according to the embodiment of the invention may further increase than a solar cell generating electric current using only light incident on the front surface of the substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
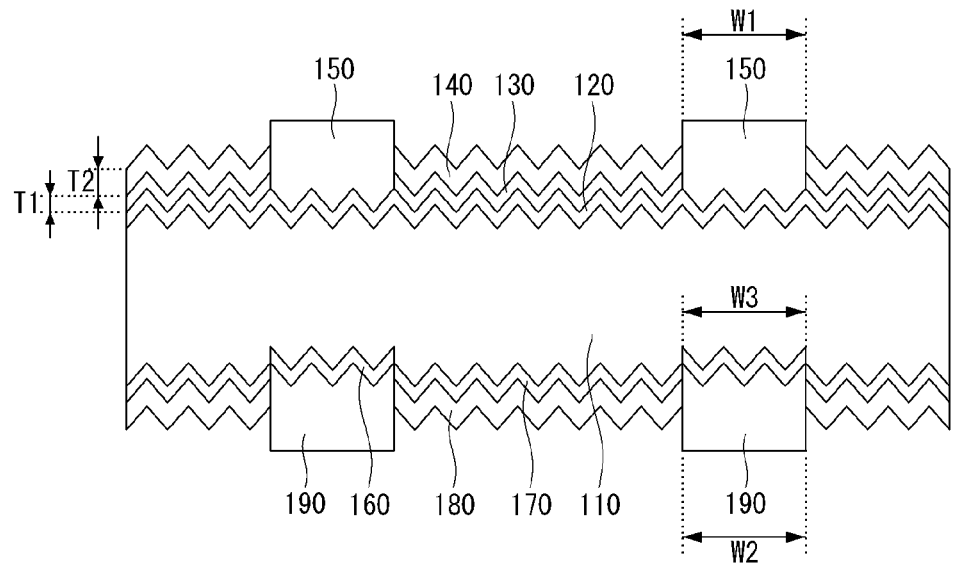
FIG. 1 is a schematic cross-sectional view of a solar cell according to a first embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

A solar cell according to an example embodiment of the invention is described in detail with reference to the accompanying drawings.

FIG. 1 is a schematic cross-sectional view of a solar cell according to a first embodiment of the invention.

As shown in FIG. 1, a solar cell according to a first embodiment of the invention includes a substrate 110, an emitter layer 120 positioned at one surface of the substrate 110, for example, a front surface of the substrate 110, a first protective layer 130 positioned on the emitter layer 120, a first anti-reflection layer 140 positioned on the first protective layer 130, a plurality of first electrodes 150 positioned on the emitter layer 120 where the first protective layer 130 and the first anti-reflection layer 140 are not positioned, a back surface field (BSF) layer 160 positioned at a back surface of the substrate 110, a second protective layer 170 positioned on the back surface of the substrate 110, a second anti-reflection layer 180 positioned on a back surface of the second protective layer 170, and a plurality of second electrodes 190 positioned on a back surface of the back surface field layer 160 where the second protective layer 170 and the second anti-reflection layer 180 are not positioned.

The substrate 110 may be formed of a silicon wafer of a first conductive type, for example, n-type, though not required. Silicon used in the substrate 110 may be crystalline silicon, such as single crystal silicon and polycrystalline silicon, or amorphous silicon. When the substrate 110 is of the n-type, the substrate 110 may contain impurities of a group V element such as phosphorus (P), arsenic (As), and antimony (Sb). The substrate 110 may have resistivity of about 1 $\Omega \cdot cm^2$ to 10 $\Omega \cdot cm^2$.

Figure 3:
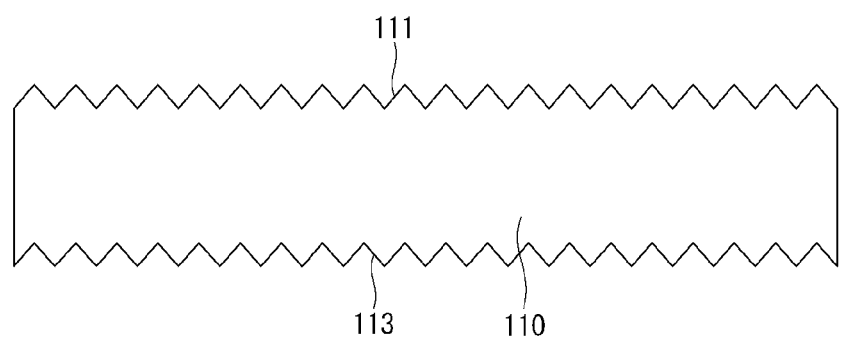
FIGS. 3 to 7 are cross-sectional views illustrating a method for manufacturing the solar cell shown in FIG. 2.
Figure 4:
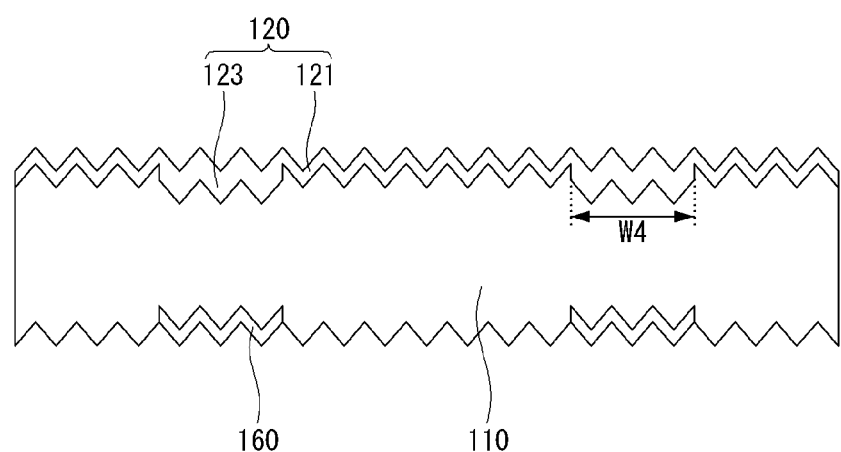
Figure 5:
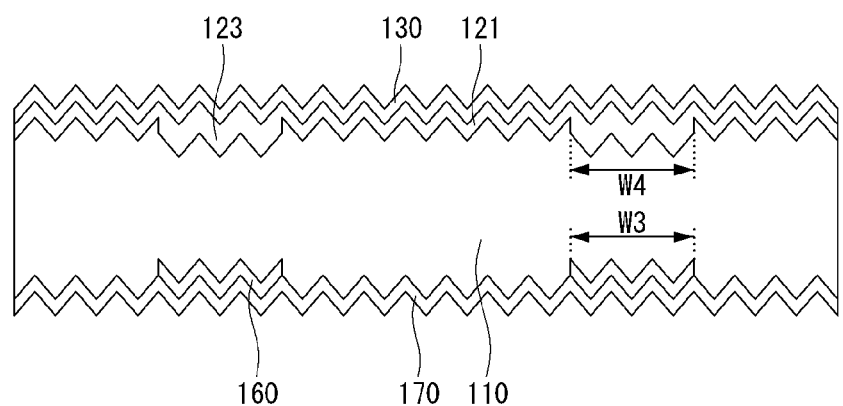
Figure 6:
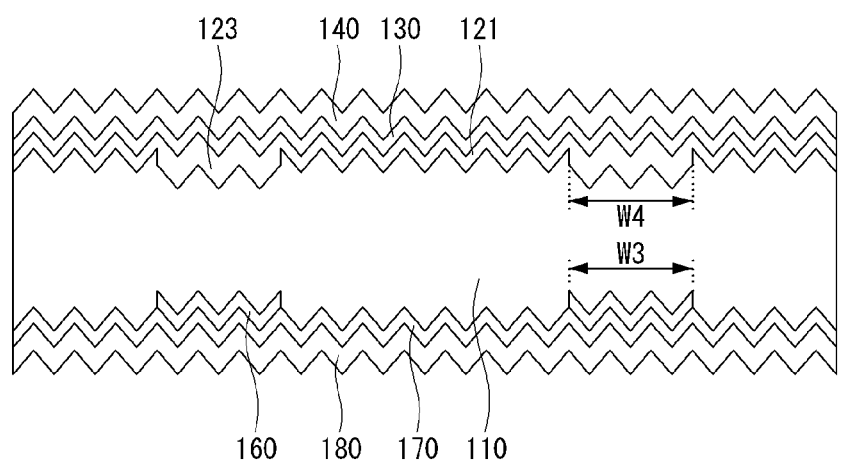
Figure 7:
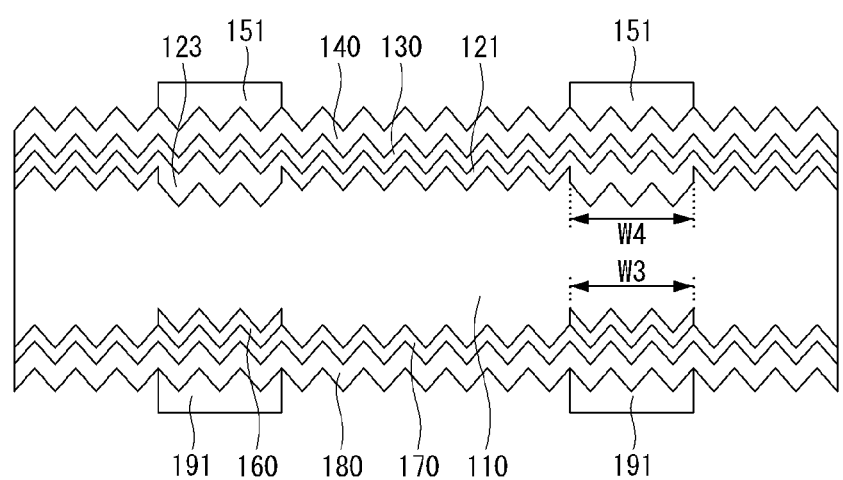

The surface of the substrate 110 may be uniformly textured to form a textured surface corresponding to an uneven surface or having uneven characteristics. More specifically, the substrate 110 has a first textured surface 111 (refer to FIG. 3) corresponding to the front surface, at which the emitter layer 120 is positioned, and a second textured surface 113 (refer to FIG. 3) corresponding to the back surface opposite the front surface.

The emitter layer 120 positioned at the first textured surface 111 of the substrate 110 is an impurity region of a second conductive type (for example, p-type) opposite the first conductive type (for example, n-type) of the substrate 110 and forms a p-n junction along with the substrate 110.

A plurality of electron-hole pairs produced by light incident on the substrate 110 are separated into electrons and holes by a built-in potential difference resulting from the p-n junction between the substrate 110 and the emitter layer 120. The separated electrons move to the n-type semiconductor, and the separated holes move to the p-type semiconductor. When the substrate 110 is of the n-type and the emitter layer 120 is of the p-type, the separated electrons and the separated holes move to the substrate 110 and the emitter layer 120, respectively.

When the emitter layer 120 is of the p-type, the emitter layer 120 may be formed by doping the substrate 110 with impurities of a group III element such as boron (B), gallium (Ga), and indium (In). The emitter layer 120 may have a surface resistivity of about 30 $\Omega$/sq to 120 $\Omega$/sq.

The first protective layer 130 positioned on the emitter layer 120 formed at the front surface of the substrate 110 is formed of a material having negative fixed charges, for example, aluminum oxide ($AlO_x$) or yttrium oxide ($Y_2O_3$). The material of the first protective layer 130 has excellent chemical passivation characteristic resulting from a low interface trap density and excellent field effect passivation characteristic resulting from the negative fixed charges. Further, the material is very excellent in stability, moisture transmission, and abrasion resistance. Thus, the first protective layer 130 reduces a surface recombination velocity, thereby improving the efficiency and the reliability of the solar cell. In an embodiment of the invention, the first protective layer 130 is formed of a material having fixed charges of the same conductive type as the first conductive type.

The first anti-reflection layer 140 positioned on the first protective layer 130 is formed of a material having positive fixed charges, for example, silicon nitride ($SiN_x$). The first anti-reflection layer 140 reduces a reflectance of light incident on the solar cell through the front surface of the substrate 110 and increases selectivity of a predetermined wavelength band, thereby increasing the efficiency of the solar cell.

In the embodiment of the invention, the first protective layer 130 has a refractive index of about 1.55 to 1.7 and a thickness T1 of about 5 nm to 30 nm, and the first anti-reflection layer 140 has a refractive index of about 1.9 to 2.3 and a thickness T2 of about 50 nm to 100 nm, so as to minimize the light reflectance at the front surface of the substrate 110.

According to an experiment conducted by the present inventors, the light reflectance at the front surface of the substrate 110 represented a minimum value when the first protective layer 130 and the first anti-reflection layer 140 were within the above refractive index and thickness ranges.

A silicon oxide layer having a thickness of about 1 nm to 3 nm may be further formed at an interface between the first protective layer 130 and the emitter layer 120.

The plurality of first electrodes 150 are positioned on the emitter layer 120 of the front surface of the substrate 110 and are electrically and physically connected to the emitter layer 120. The first electrodes 150 extend substantially parallel to one another in a fixed direction. The first electrodes 150 collect carriers (for example, holes) moving to the emitter layer 120.

The first electrodes 150 may be formed of at least one conductive material selected from the group consisting of nickel (Ni), copper (Cu), tin (Sn), zinc (Zn), indium (In), titanium (Ti), gold (Au), and a combination thereof. In the embodiment of the invention, the first electrodes 150 is formed of a conductive paste obtained by mixing a mixture (Ag:Al) of silver (Ag) and aluminum (Al) with a glass fit.

Alternatively, the first electrodes 150 may be formed using a plating process. In this instance, the first electrode 150 may include a metal seed layer and a conductive layer plated on the metal seed layer. A diffusion prevention layer may be further formed between the metal seed layer and the conductive layer, thereby preventing a material forming the conductive layer from being diffused into the doped region through the metal seed layer.

The metal seed layer may be formed of nickel silicide or aluminum silicide. The conductive layer may contain at least one material selected from the group consisting of copper (Cu), silver (Ag), aluminum (Al), tin (Sn), zinc (Zn), indium (In), titanium (Ti), gold (Au), and a combination thereof.

The plurality of second electrodes 190 are formed on the back surface of the substrate 110 in the same structure as the first electrodes 150. The second electrodes 190 having the above-described structure collect carriers (for example, electrons) moving to the substrate 110 and output the carriers to an external device.

The second electrodes 190 may be formed of at least one conductive material selected from the group consisting of aluminum (Al), nickel (Ni), copper (Cu), silver (Ag), tin (Sn), zinc (Zn), indium (In), titanium (Ti), gold (Au), and a combination thereof. In the embodiment of the invention, the second electrodes 190 are formed of a conductive paste obtained by mixing Ag with a glass frit. Alternatively, the second electrodes 190 may be formed using the plating process in the same manner as the first electrodes 150.

In the embodiment of the invention, a width W1 of the first electrode 150 is substantially equal to a width W2 of the second electrode 190 (i.e., W1=W2).

The back surface field layer 160 electrically and physically connected to the second electrodes 190 is locally positioned at the back surface of the substrate 110 at the same location as the second electrodes 190. The back surface field layer 160 is a region (for example, $n^+$-type region) that is more heavily doped than the substrate 110 with impurities of the same conductive type as the substrate 110. In the embodiment of the invention, the back surface field layer 160 has a surface resistivity of about 30 Ω/sq to 80 Ω/sq. A width W3 of the back surface field layer 160 may be equal to or less than the width W2 of the second electrode 190 or may be greater than the width W2 of the second electrode 190.

The movement of holes to the back surface of the substrate 110 is prevented or reduced by a potential barrier resulting from a difference between impurity concentrations of the substrate 110 and the back surface field layer 160. Hence, a recombination and/or a disappearance of electrons and holes around the surface of the substrate 110 are prevented or reduced.

The second protective layer 170 and the second anti-reflection layer 180 are positioned on the back surface of the substrate 110 where the second electrodes 190 and the back surface field layer 160 are not positioned.

In the embodiment of the invention, the second protective layer 170 is formed of the same material as the first protective layer 130 and has the same thickness as the first protective layer 130. Further, the second anti-reflection layer 180 is formed of the same material as the first anti-reflection layer 140 and has the same thickness as the first anti-reflection layer 140. Nevertheless, different materials or other materials may be used.

Because the second protective layer 170 positioned on the back surface of the substrate 110 is formed of a material having negative fixed charges, for example, aluminum oxide ($AlO_x$) or yttrium oxide ($Y_2O_3$), carriers (for example, electrons) moving to the back surface of the substrate 110 is affected by the second protective layer 170. However, in the embodiment of the invention, because the back surface field layer 160 is locally positioned at only the same location as the second electrodes 190, an influence of the second protective layer 170 formed of aluminum oxide ($AlO_x$) or yttrium oxide ($Y_2O_3$) on carriers moving to the back surface field layer 160 may be minimized. In an embodiment of the invention, the second protective layer 170 is formed of a material having fixed charges of the same conductive type as the first conductive type.

The solar cell having the above-described structure according to the embodiment of the invention may serve as a double-sided (or bifacial) light receiving solar cell, and an operation of the solar cell is described below.

When light irradiated onto the solar cell is incident on the substrate 110 through the emitter layer 120 and/or the back surface of the substrate 110, a plurality of electron-hole pairs are generated in the substrate 110 by the light energy. In this instance, because the front surface and the back surface of the substrate 110 are the first textured surface 111 and the second textured surface 113, respectively, the light reflectance at each of the front surface and the back surface of the substrate 110 may be reduced. Further, because both a light incident operation and a light reflection operation may be performed on each of the first and second textured surfaces 111 and 113 of the substrate 110, light may be confined in the solar cell. Hence, light absorption may increase, and the efficiency of the solar cell may be improved. In addition, because a reflection loss of the light incident on the substrate 110 may be reduced by the first protective layer 130 and the first anti-reflection layer 140 positioned on the front surface of the substrate 110 and the second protective layer 170 and the second anti-reflection layer 180 positioned on the back surface of the substrate 110, an amount of light incident on the substrate 110 may further increase.

The electron-hole pairs are separated into electrons and holes by the p-n junction between the substrate 110 and the emitter layer 120, and the separated holes move to the p-type emitter layer 120 and the separated electrons move to the n-type substrate 110. The holes moving to the emitter layer 120 move to the first electrodes 150, and the electrons moving to the substrate 110 move to the second electrodes 190 through the back surface field layer 160. Accordingly, when the first electrodes 150 of one solar cell are connected to the second electrodes 190 of another solar cell adjacent to the one solar cell using electric wires such as interconnectors, electric current flows through the solar cells and allows use of the electric current for electric power.

The solar cell having the above-described configuration may be used in a state where the solar cell is positioned between a light transmission front substrate and a light transmission back substrate and is sealed by a protective layer.

Figure 2:
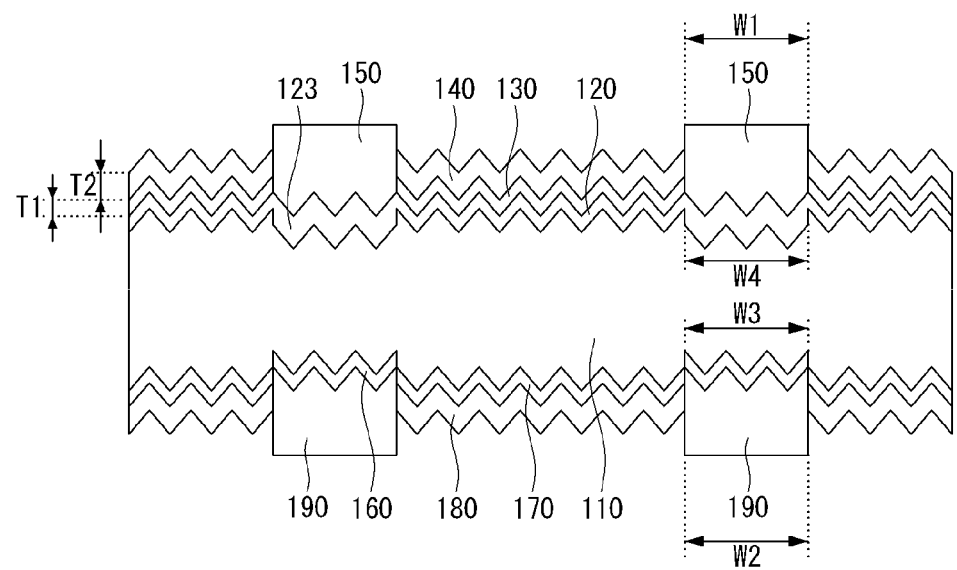
FIG. 2 is a schematic cross-sectional view of a solar cell according to a second embodiment of the invention.

A solar cell according to a second embodiment of the invention is described below with reference to FIG. 2.

Since the solar cell according to the second embodiment of the invention is substantially the same as the solar cell according to the first embodiment of the invention except an emitter layer, a further description may be briefly made or may be entirely omitted. Hereinafter, only a configuration of the emitter layer is described.

The emitter layer 120 according to the first embodiment of the invention has a uniform doping concentration throughout the entire area of the emitter layer 120. Thus, the emitter layer 120 according to the first embodiment of the invention may be easily manufactured through a simple process, but a recombination of carriers of the emitter layer 120 may increase because of a high doping concentration. As a result, an improvement in the efficiency of the solar cell may be limited.

Accordingly, the emitter layer 120 according to the second embodiment of the invention is configured so that the recombination of carriers of the emitter layer 120 is prevented or reduced. More specifically, the emitter layer 120 contacting first electrodes 150 is a heavily doped region, and the emitter layer 120 not contacting the first electrodes 150 is a lightly doped region.

In other words, the emitter layer 120 according to the second embodiment of the invention includes a first doped region 121 corresponding to a lightly doped p-type region and a second doped region 123, which is more heavily doped than the first doped region 121 with p-type impurities.

The second doped region 123 may be formed at the same location of the substrate 110 as the first electrodes 150. A width W4 of the second doped region 123 may be equal to or less than a width W1 of the first electrode 150 or may be greater than the width W1 of the first electrode 150.

The first doped region 121 has a surface resistivity of about 80 Ω/sq to 200 Ω/sq, and the second doped region 123 has a surface resistivity of about 30 Ω/sq to 80 Ω/sq.

Accordingly, the solar cell according to the second embodiment of the invention prevents or reduces the recombination of carriers, and thus the efficiency of the solar cell according to the second embodiment of the invention may be further improved.

A method for manufacturing the solar cell according to the second embodiment of the invention is described below with reference to FIGS. 3 to 7.

A substrate 110 formed of a silicon wafer is generally manufactured by slicing a silicon block or an ingot using a blade or a multi-wire saw.

More specifically, the silicon wafer is prepared and then is doped with impurities of a group V element, for example, phosphorus (P) to manufacture the substrate 110 having resistivity of about 1 Ω·cm$^2$ to 10 Ω·cm$^2$.

When the silicon block or the ingot is sliced, a mechanical damage layer may be formed in the silicon wafer. Thus, a wet etching process for removing the mechanical damage layer is performed, so as to prevent a reduction in characteristics of the solar cell resulting from the mechanical damage layer. An alkaline etchant or an acid etchant may be used in the wet etching process.

After the mechanical damage layer is removed, the wet etching process or a dry plasma etching process is performed to form a first textured surface 111 in the front surface of the substrate 110 and a second textured surface 113 in the back surface of the substrate 110.

Next, impurities of a group III element are injected into one surface (for example, the first textured surface 111) of the substrate 110 using an ion implantation method to form an emitter layer 120.

Because it is easy to control a production amount of ions and an ion velocity moving to the substrate 110 in the ion implantation method, an amount of ions implanted into the substrate 110 and an ion implantation depth when the substrate 110 is doped with impurities using the ion implantation method are controlled more easily than when the substrate 110 is doped with impurities using a thermal diffusion method.

When the emitter 120 is formed using the ion implantation method, the ion implantation depth may vary depending on an amount of ions produced in a process room, an ion implantation energy, and the like.

In this instance, the ion implantation energy may be about 100 KeV to 3 MeV, and the ion implantation depth based on the ion implantation energy of about 100 KeV to 3 MeV may be about 0.5 μm to 10 μm measured from the surface of the substrate 110.

When the emitter layer 120 is formed using the ion implantation method, impurities are lightly injected into the entire front surface of the substrate 110 to form a first doped region 121.

Next, impurities are heavily injected into a portion (for example, an area to form first electrodes 150) of the front surface of the substrate 110 to form a second doped region 123.

In this instance, the first doped region 121 has the surface resistivity of about 80 Ω/sq to 200 Ω/sq, and the second doped region 123 has the surface resistivity of about 30 Ω/sq to 80 Ω/sq.

The emitter layer 120 including the first doped region 121 and the second doped region 123 may be formed using the thermal diffusion method in another embodiment of the invention.

Impurities of a group V element are injected into a portion (for example, an area to form second electrodes 190) of the other surface (for example, the second textured surface 113) of the substrate 110 to form a back surface field layer 160 having a surface resistivity of about 30 Ω/sq to 80 Ω/sq.

Further, the ion implantation method may be used to form the back surface field layer 160 in the same manner as the emitter layer 120.

Subsequently, a natural oxide layer is removed by etching the substrate 110 using hydrofluoric acid (HF). Further, aluminum oxide ($AlO_x$) or yttrium oxide ($Y_2O_3$) is deposited on the front surface and the back surface of the substrate 110 to form a first protective layer 130 and a second protective layer 170. The first protective layer 130 and the second protective layer 170 may be formed using a plasma enhanced chemical vapor deposition (PECVD) method, a sputtering method, or other methods. In this instance, the first protective layer 130 and the second protective layer 170 are formed so that they have a refractive index of about 1.55 to 1.7 and a thickness of about 5 nm to 30 nm.

When the first protective layer 130 and the second protective layer 170 are formed, a silicon oxide layer having a thickness of about 1 nm to 3 nm may be formed at interfaces between the first protective layer 130 and the substrate 110, and the second protective layer 170 and the substrate 110.

After the first protective layer 130 and the second protective layer 170 are formed, silicon nitride ($SiN_x$) is deposited on a first anti-reflection layer 140 and a second anti-reflection layer 180. The first anti-reflection layer 140 and the second anti-reflection layer 180 may be formed using the PECVD method, the sputtering method, or other methods.

In this instance, the first anti-reflection layer 140 and the second anti-reflection layer 180 are formed so that they have a refractive index of about 1.9 to 2.3 and a thickness of about 50 nm to 100 nm. The second anti-reflection layer 180 formed on the back surface of the substrate 100 may be thicker than the first anti-reflection layer 140 formed on the front surface of the substrate 100.

Subsequently, a first conductive paste 151 obtained by mixing a mixture (Ag:Al) of silver (Ag) and aluminum (Al) with a glass frit is printed on the front surface of the substrate 100 with a first electrode pattern, and a second conductive paste 191 obtained by mixing Ag with the glass frit is printed on the back surface of the substrate 100 with a second electrode pattern. A firing process is then performed on the first conductive paste 151 and the second conductive paste 191.

In the firing process, the material of the protective layers 130 and 170 and the material of the anti-reflection layers 140 and 180 are etched by an etching component contained in the glass frit. Hence, the first electrodes 150 electrically and physically connected to the second doped region 123 of the emitter layer 120 are formed, and the second electrodes 190 electrically and physically connected to the back surface field layer 160 are formed.

Alternatively, the first electrodes 150 and the second electrodes 190 may be formed using a plating process.

A portion of the surface of the substrate 110 to form the first electrodes 150 and the second electrodes 190 has to be exposed so as to form the first electrodes 150 and the second electrodes 190 using the plating process. Thus, the same portion between the first protective layer 130 and the first anti-reflection layer 140 and the same portion between the second protective layer 170 and the second anti-reflection layer 180 may be removed using a dry etching process to form the first electrodes 150 and the second electrodes 190 on the removed portions of the surface of the substrate 110.

When the first electrodes 150 and the second electrodes 190 are formed, a metal seed layer may be formed on the exposed portions of the surface of the substrate 110 and then a conductive layer or a diffusion prevention layer and a conductive layer may be formed on the metal seed layer.

In embodiments of the invention, reference to fixed charges includes oxide fixed charges.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bifacial solar cell comprising:
    a substrate of an n-type, the substrate having a front textured surface and a rear textured surface;
    a p-type emitter layer positioned at the front textured surface of the substrate;
    a plurality of first electrodes locally positioned on the p-type emitter layer and electrically connected to the p-type emitter layer;
    a first aluminum oxide layer positioned on the p-type emitter layer and having negative fixed charges;
    a silicon oxide layer formed at an interface between the first aluminum oxide layer and the p-type emitter layer, the silicon oxide layer having a thickness of about 1 nm to 3 nm;
    a first anti-reflection layer positioned on the first aluminum oxide layer and containing silicon nitride ($SiN_x$);
    a plurality of n-type back surface field layers locally positioned at the rear textured surface of the substrate;
    a rear passivation layer directly positioned on the rear textured surface of the substrate;
    and
    a plurality of second electrodes respectively positioned on the plurality of n-type back surface field layers and electrically connected to the plurality of n-type back surface field layers through the rear passivation layer,
    wherein the rear passivation layer is formed of the same material as the first aluminum oxide layer and has the same thickness as the first aluminum oxide layer.

2. The bifacial solar cell of claim 1, further comprising a second anti-reflection layer positioned on the rear textured surface of the substrate.

3. The bifacial solar cell of claim 2, wherein each of the first aluminum oxide layer and the rear passivation layer has a refractive index of about 1.55 to 1.7, and
    wherein each of the first aluminum oxide layer and the rear passivation layer has a thickness of about 5 nm to 30 nm.

4. The bifacial solar cell of claim 2, wherein a width of each of the n-type back surface field layers is equal to or less than a width of each second electrode.

5. The bifacial solar cell of claim 2, wherein a width of each of the n-type back surface field layers is greater than a width of each second electrode.

6. The bifacial solar cell of claim 2, wherein each of the first anti-reflection layer and the second anti-reflection layer has a refractive index of about 1.9 to 2.3, and
    wherein each of the first anti-reflection layer and the second anti-reflection layer has a thickness of about 50 nm to 100 nm.

7. The bifacial solar cell of claim 1, wherein the plurality of first electrodes are formed of a first conductive paste including a glass frit and a mixture (Ag:Al) of silver (Ag)

and aluminum (Al), and the plurality of second electrodes are formed of a second conductive paste including a glass frit and silver (Ag), and wherein each of the plurality of second electrodes protrudes through a hole in the rear passivation layer.

8. The bifacial solar cell of claim 1, wherein the plurality of first electrodes are formed to be parallel to each other with a certain width and the plurality of second electrodes are formed to be parallel to each other with a certain width.

9. The bifacial solar cell of claim 1, wherein the p-type emitter layer includes a first doped region, which is doped with impurities of the p-type, and a second doped region, which is more heavily doped than the first doped region with impurities of the p-type.

10. The bifacial solar cell of claim 9, wherein the second doped region is formed at the same location of the substrate as the plurality of first electrodes.

11. The bifacial solar cell of claim 10, wherein a width of the second doped region is equal to or less than a width of each of the first electrodes.

12. The bifacial solar cell of claim 10, wherein a width of the second doped region is greater than a width of each of the first electrodes.

13. The bifacial solar cell of claim 10, wherein the first doped region has a surface resistivity of about 80 $\Omega$/sq to 200 $\Omega$/sq.

14. The bifacial solar cell of claim 10, wherein the second doped region has a surface resistivity of about 30 $\Omega$/sq to 80 $\Omega$/sq.

15. The bifacial solar cell of claim 2, wherein the rear passivation layer and the plurality of n-type back surface field layers are not overlapping each other.

16. The bifacial solar cell of claim 2, wherein the rear passivation layer contacts the second textured surface of the substrate in an area between adjacent n-type back surface field layers.

17. The bifacial solar cell of claim 6, wherein a thickness of the second anti-reflection layer is equal to or larger than a thickness of the first anti-reflection layer.

18. The bifacial solar cell of claim 1, wherein the plurality of first electrodes are formed of different compositions from the plurality of second electrodes.

19. The bifacial solar cell of claim 17, wherein the thickness of the second anti-reflection layer is larger than the thickness of the first anti-reflection layer.

* * * * *